US007665459B2

(12) United States Patent
Lowstuter, Jr.

(10) Patent No.: US 7,665,459 B2
(45) Date of Patent: Feb. 23, 2010

(54) ENCLOSED SOLAR COLLECTOR

(75) Inventor: William R. Lowstuter, Jr., Golden, CO (US)

(73) Assignee: Energistic Systems, LLC, Golden, CO (US)

( * ) Notice: Subject to any disclaimer, the term of this patent is extended or adjusted under 35 U.S.C. 154(b) by 81 days.

(21) Appl. No.: 11/737,023

(22) Filed: Apr. 18, 2007

(65) Prior Publication Data

US 2008/0257335 A1 Oct. 23, 2008

(51) Int. Cl.
*F24J 2/12* (2006.01)
*F24J 2/04* (2006.01)
*F24J 2/06* (2006.01)
*F24J 2/10* (2006.01)
*F24J 2/24* (2006.01)

(52) U.S. Cl. .................. 126/694; 126/576; 126/600; 126/605; 126/634; 126/690; 126/692; 237/56; 250/206.1; 432/219

(58) Field of Classification Search ............... 126/692, 126/570, 572, 573, 578, 593, 600, 702; 49/82.1; 454/276, 277, 278, 325; 62/183, 507; 74/10.9, 74/813 R, 813 C, 825, 831, 832, 469, 471 R, 74/473.12, 594.1
See application file for complete search history.

(56) References Cited

U.S. PATENT DOCUMENTS

| 1,162,505 | A | * | 11/1915 | Nichols | .................... | 126/604 |
| 1,946,184 | A | * | 2/1934 | Abbot | .................... | 126/603 |
| 3,043,923 | A | | 7/1962 | Sonobe et al. | | |
| 3,123,098 | A | * | 3/1964 | Bishop | .................. | 137/601.06 |
| 3,571,973 | A | * | 3/1971 | Roberts | .................... | 49/2 |
| 3,699,873 | A | * | 10/1972 | Irvin | .................... | 454/319 |
| 3,769,810 | A | * | 11/1973 | Swartwout | .................. | 62/183 |
| 3,928,937 | A | * | 12/1975 | Dovman | .................... | 49/403 |

(Continued)

FOREIGN PATENT DOCUMENTS

KR 100343263 B 6/2002

(Continued)

OTHER PUBLICATIONS

International Search Report dated Aug. 15, 2008, in corresponding PCT/US2008/59657.

*Primary Examiner*—Steven B McAllister
*Assistant Examiner*—Daniel E Namay
(74) *Attorney, Agent, or Firm*—Dorsey & Whitney LLP (57) ABSTRACT

A solar collector includes a plurality of elongated parabolic reflectors mounted within a glass-topped enclosure for pivotal movement such that each reflector is incrementally pivoted throughout the course of a day to remain substantially perpendicular to the sun. The incremental pivotal movement is caused by a motor energized from a solar switch having solar cells that also pivot throughout the day so that in one position of the switch, no electricity is being generated and transferred to the motor, but in a second position, the switch receives solar radiation and energizes the motor to again incrementally pivot each reflector along with the solar switch. The reflectors are therefore incrementally pivoted throughout the course of a day to follow the sun for optimal collection of solar radiation which is used to heat liquid carried by tubes positioned at the axis of generation of the parabolic reflectors and/or strips of solar cell material so that electricity can be generated alone, liquid heated alone, or liquid heated and electricity generated simultaneously.

10 Claims, 10 Drawing Sheets

U.S. PATENT DOCUMENTS

| | | | | |
|---|---|---|---|---|
| 3,934,797 | A * | 1/1976 | Perlmutter | 236/46 R |
| 3,943,688 | A * | 3/1976 | Billings | 56/328.1 |
| 4,038,972 | A | 8/1977 | Orrison | |
| 4,098,264 | A | 7/1978 | Brokaw | |
| 4,103,672 | A | 8/1978 | Meyer | |
| 4,107,521 | A * | 8/1978 | Winders | 250/203.4 |
| 4,146,785 | A * | 3/1979 | Neale | 250/203.4 |
| 4,178,913 | A | 12/1979 | Hutchison | |
| 4,199,898 | A * | 4/1980 | Connor | 49/91.1 |
| 4,205,659 | A | 6/1980 | Beam | |
| 4,262,195 | A * | 4/1981 | White et al. | 250/203.4 |
| 4,362,931 | A * | 12/1982 | Maruko et al. | 250/203.4 |
| 4,367,403 | A * | 1/1983 | Miller | 250/203.4 |
| 4,481,734 | A * | 11/1984 | Vaida | 49/91.1 |
| 4,559,926 | A | 12/1985 | Butler | |
| 4,561,423 | A | 12/1985 | Blasey | |
| 4,602,613 | A * | 7/1986 | Barr | 126/600 |
| 4,649,900 | A | 3/1987 | Trihey | |
| 4,688,351 | A * | 8/1987 | Torres | 49/74.1 |
| 4,730,602 | A * | 3/1988 | Posnansky et al. | 126/605 |
| 5,267,414 | A * | 12/1993 | Vaida | 49/74.1 |
| 5,531,215 | A | 7/1996 | Schwarz | |
| 6,018,122 | A * | 1/2000 | Hibino et al. | 136/246 |
| 6,020,553 | A | 2/2000 | Yogev | |
| 6,080,927 | A * | 6/2000 | Johnson | 136/248 |
| 6,276,359 | B1 * | 8/2001 | Frazier | 126/686 |
| 6,363,928 | B1 | 4/2002 | Anderson, Jr. | |
| 6,717,045 | B2 | 4/2004 | Chen | |
| 6,849,842 | B2 * | 2/2005 | Little | 250/203.4 |
| 7,077,123 | B2 * | 7/2006 | Jarvinen | 126/573 |
| 2002/0007830 | A1 * | 1/2002 | Fukutake et al. | 126/655 |
| 2002/0023638 | A1 | 2/2002 | Buron et al. | |
| 2004/0216734 | A1 | 11/2004 | Lawheed | |
| 2006/0172679 | A1 * | 8/2006 | Gehring et al. | 454/152 |
| 2006/0172680 | A1 * | 8/2006 | Gehring et al. | 454/152 |
| 2006/0248801 | A1 * | 11/2006 | Marocco | 49/74.1 |
| 2008/0178526 | A1 * | 7/2008 | Browne et al. | 49/82.1 |

FOREIGN PATENT DOCUMENTS

| | | |
|---|---|---|
| RU | 2147358 | 4/2000 |
| SI | 21861 | 2/2006 |
| WO | WO 2008/130838 | 10/2008 |

* cited by examiner

ENCLOSED SOLAR COLLECTOR

BACKGROUND OF THE INVENTION

1. Field of the Invention

The present invention relates generally to solar collectors and more particularly to an enclosed solar collector having a plurality of pivotal parabolic reflectors with systems mounted along their axis of generation for converting solar radiation to heated liquid and/or electricity. The parabolic reflectors are connected together with linkage for unitary pivotal movement so as to follow the course of the sun and a solar switch is utilized for incrementally driving a motor to maintain a perpendicular relationship of the reflectors with the sun. The entire system is mounted within an enclosed box with a glass top.

2. Description of the Relevant Art

Systems for harnessing the energy generated by the sun have been investigated for many years, and in recent years, collectors have been developed for capturing solar energy so that heat transfer fluids can be heated within the collector and transferred to other locations for domestic or commercial use in heating water, air or the like. Most such systems have a plurality of black fluid conducting tubes confined within a glass enclosed box so the radiation from the sun will heat the tubes and the liquid being carried therein before it is transferred to a remote site for domestic or commercial use. Temperature sensors and pumps are utilized so the fluid is only transferred when it attains a certain predetermined temperature and typically glycol or other liquids having low freezing points are utilized as the collectors may be exposed to environmental elements, which in the winter, can be extreme.

Solar cells are also well known and are designed to generate electricity from solar energy. Accordingly, instead of using liquids in which heat can be collected, stored and transmitted to a remote location for use in heating air or water, solar cells generate electricity, which can also be transferred to remote locations for domestic or commercial uses.

It is also known that parabolic surfaces will reflect solar rays as emanated from the sun and focus them along an axis of generation of the parabola to concentrate the sun's rays along a line. Accordingly, by placing liquid-conducting tubes along that axis of generation, the efficiency of a solar collector can be enhanced. Such systems are currently utilized in large commercial establishments and typically the parabolic surfaces are made of a reflective material and exposed to the elements.

In some instances, the parabolic reflectors are also mounted to follow the sun so the incident rays received from the sun are received in perpendicular relationship to the parabola whereby the rays are more efficiently concentrated along the axis of generation of the parabola.

While many systems have been developed for collecting and transferring energy generated by the sun, efficient collectors have not been developed where a plurality of parabolic reflectors mounted to follow the sun are enclosed in a glass-topped box. It is to this end that the present invention has been developed.

SUMMARY OF THE INVENTION

A solar collector in accordance with the present invention includes a plurality of elongated linear reflectors of parabolic transverse cross-section having liquid-carrying tubes and/or strips of solar cell material extending along the axis of generation of the parabola. The elongated parabolic reflectors are mounted to a linkage system so they can be incrementally pivoted in unison through the course of a day to remain perpendicular to the rays of the sun for optimal transfer of solar energy to the axis of generation of the reflectors. A motor is operatively connected to the linkage, and a solar switch to the motor so that as the sun traverses the sky from east to west during the course of a day, the solar switch is energized and de-energized to energize and de-energize the motor, which through the linkage pivots the parabolic reflectors to remain perpendicular to the sun. The parabolic reflectors and the linkage system are mounted in an enclosed glass-topped box to further retain the heat from the sun and optimize the conversion of the solar energy to thermal or electrical energy.

Other aspects, features, and details of the present invention can be more completely understood by reference to the following detailed description of a preferred embodiment, taken in conjunction with the drawings and from the appended claims.

DESCRIPTION OF THE PREFERRED EMBODIMENTS

Figure 1A:
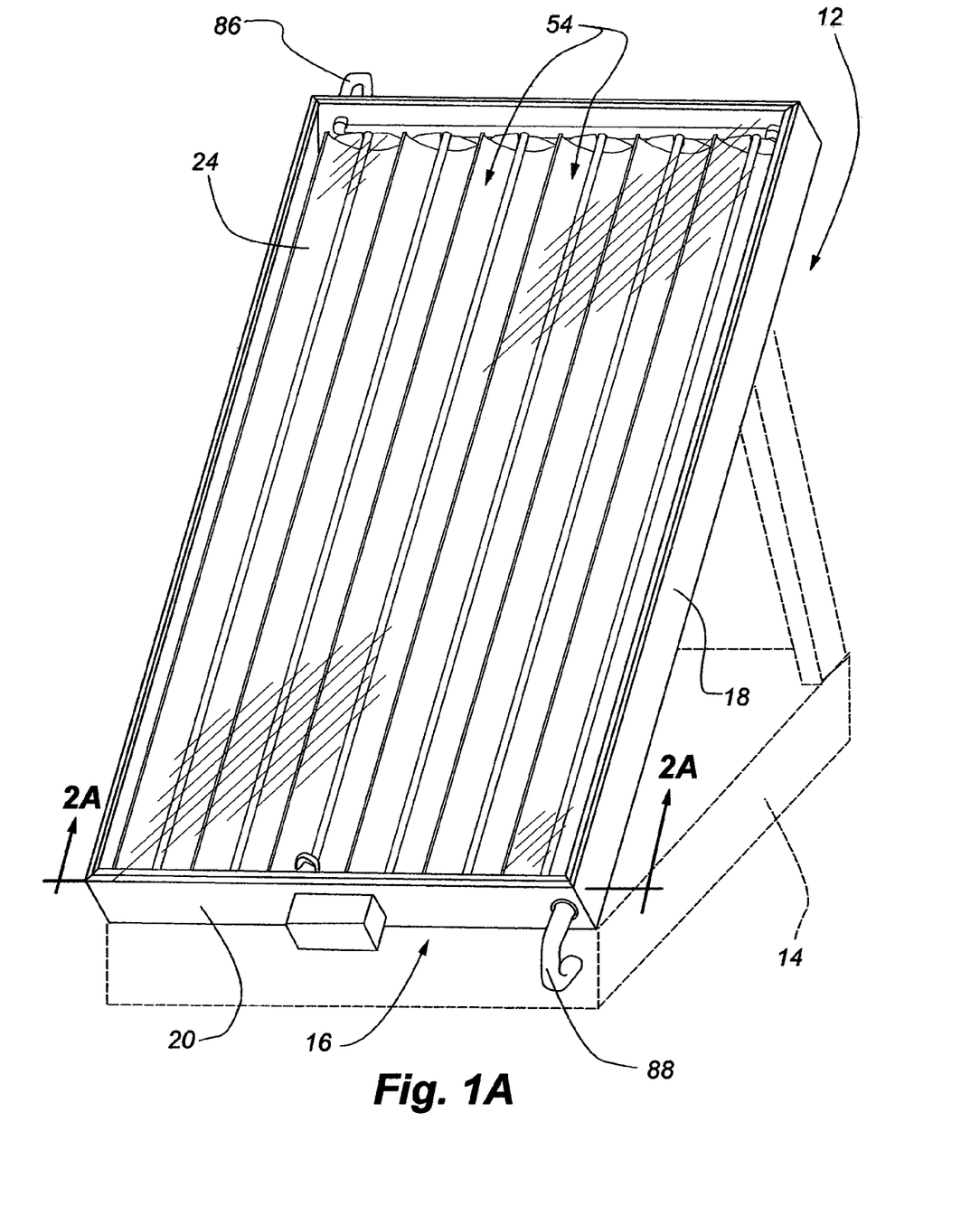
FIG. 1A is an isometric of a solar collector in accordance with the present invention mounted on a support framework shown in dashed lines.

The solar collector 12 of the present invention can be seen in FIG. 1A mounted on an adjustable base 14 shown in dashed lines. The base does not form part of the present invention and could be any suitable base, which could be used to optimally position the collector for receipt of radiation from the sun.

Figure 1B:
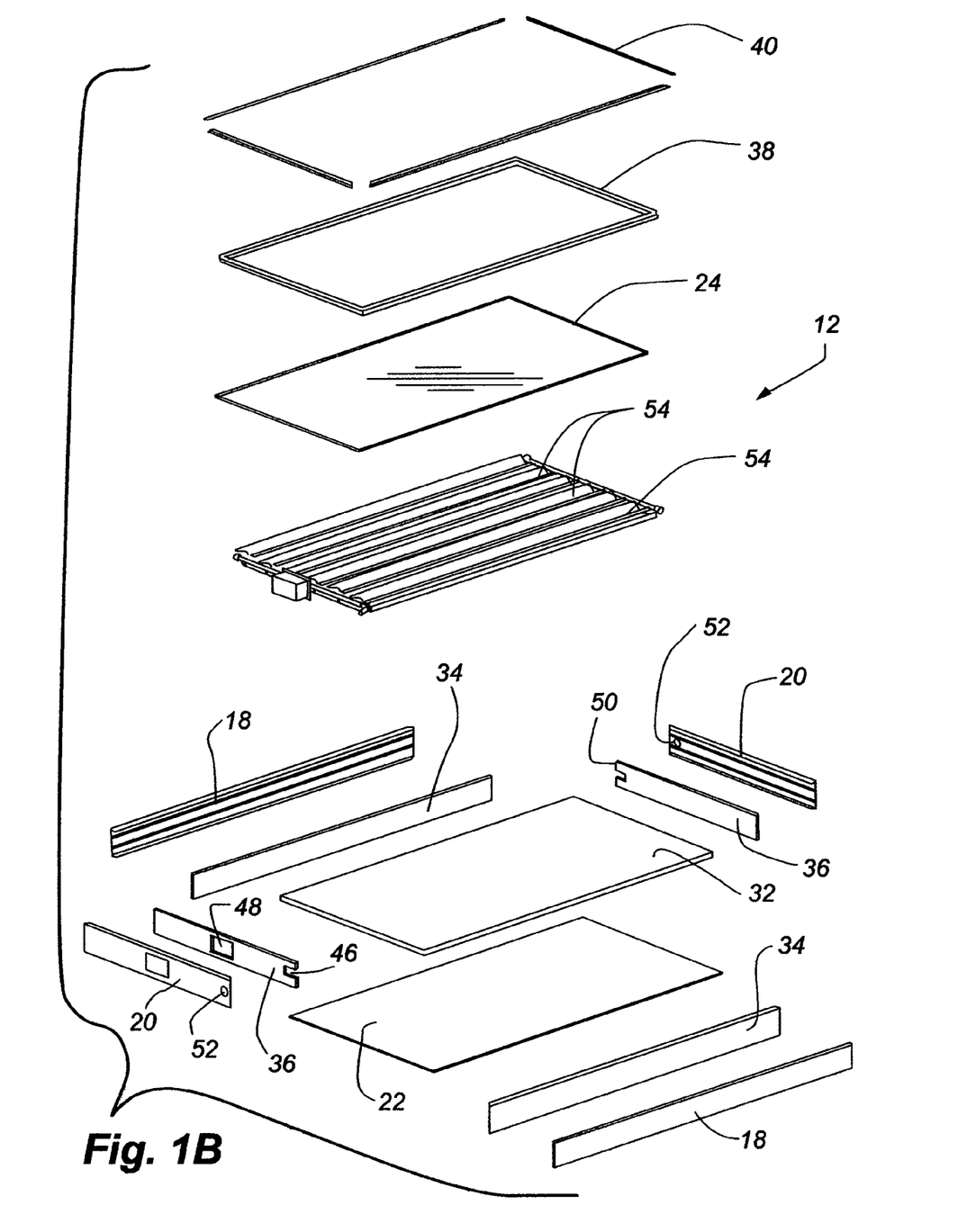
FIG. 1B is a diagrammatic exploded isometric of the collector of the present invention.
Figure 4:
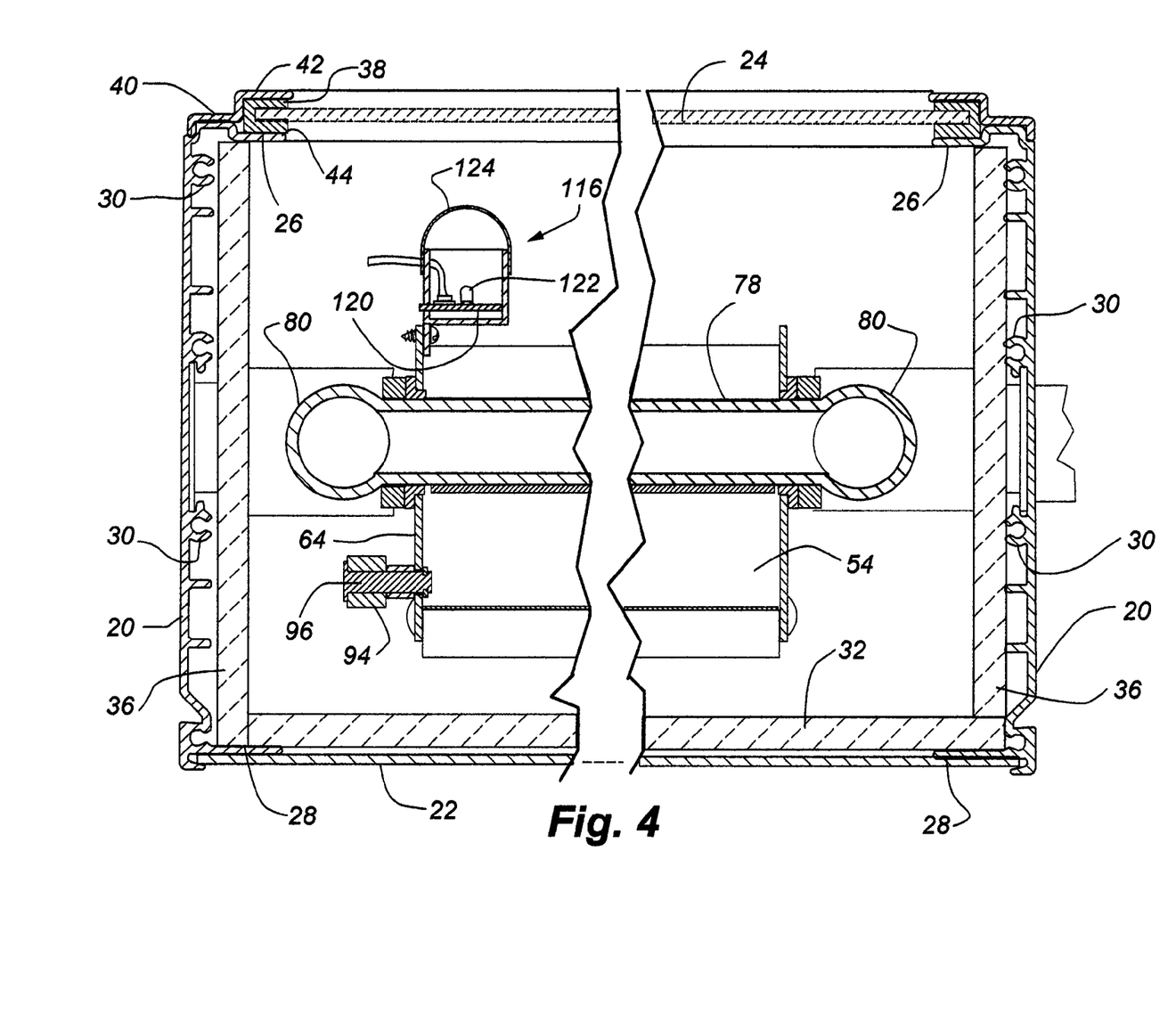
FIG. 4 is an enlarged section taken along line 4-4 of FIG. 2A.
Figure 5:
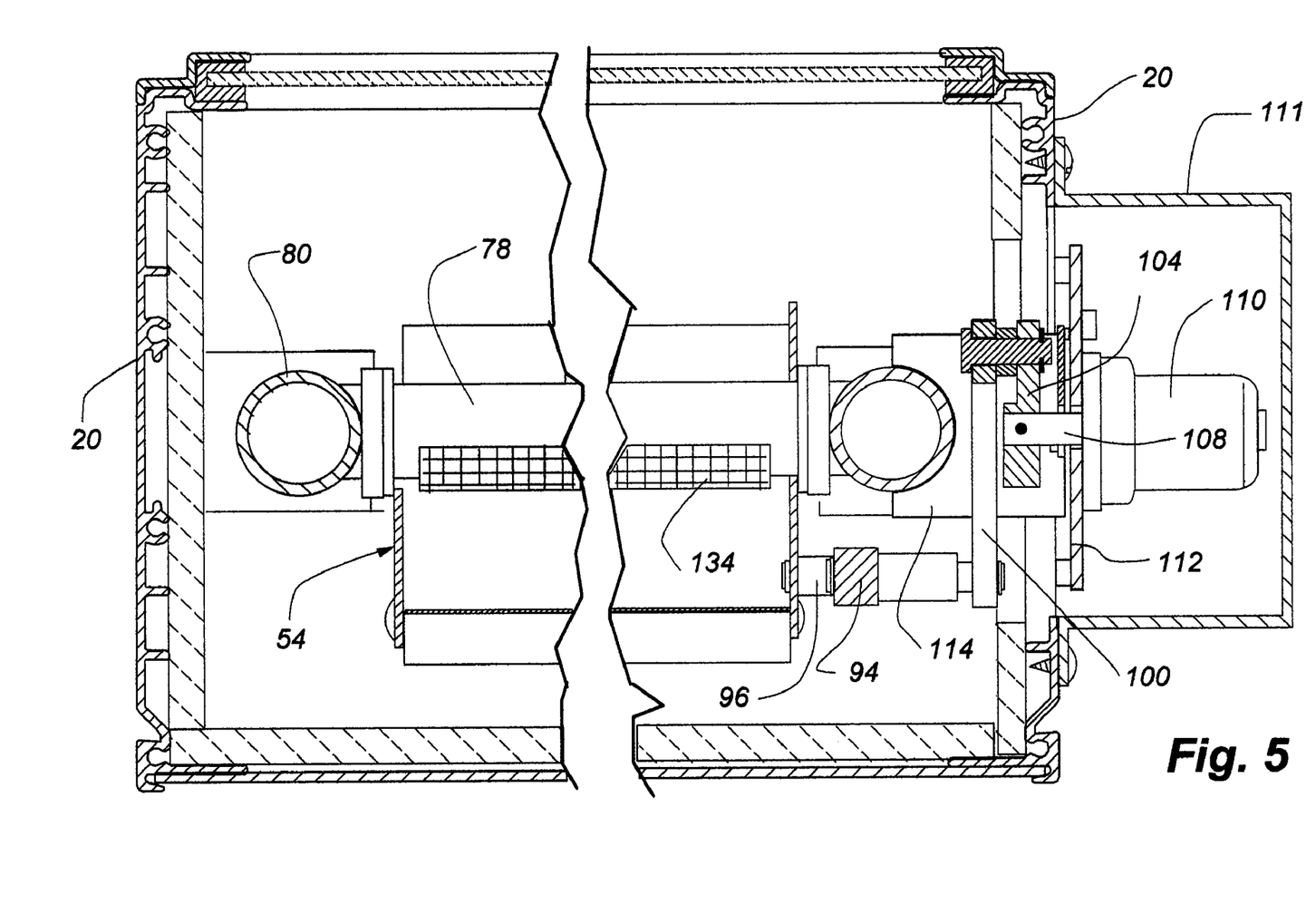
FIG. 5 is an enlarged section taken along line 5-5 of FIG. 2A.

With reference to FIGS. 1A and 1B, the solar collector 12 can be seen to include an enclosed box 16 having side walls 18, end walls 20 and a bottom wall 22. The walls of the box are all made of a suitable material, preferably aluminum and a top for the box is made of a transparent glass panel 24. The walls and the top are interconnected to define a substantially thermally sealed box. The side walls and end walls, which can also be seen in FIG. 4, for example, are of identical cross-section and made of an extruded material such as aluminum that is somewhat channel shaped having upper 26 and lower 28 inwardly directed flanges and longitudinally extending C-shaped channels 30 having open ends into which fasteners can be threaded to secure the side walls and end walls together. A bottom sheet 32 of insulation is seated on the bottom wall 22 of the enclosure and vertical side 34 and end strips 36 of insulation are positioned within the side 18 and end 20 walls, respectively, to insulate the enclosure. The glass panel is peripherally seated in a weather-tight rubber strip 38 of generally U-shaped transverse cross-section so as to encompass the peripheral edge of the glass panel and thermally seal the glass panel to the remainder of the enclosure 16. A cap strip 40 is provided along each side wall and end wall at the top thereof, which can be screwed or otherwise secured to the adjacent side wall or end wall and defines an overhanging lip 42 that confronts an adjacent flange 26 on the side or end wall to define a pocket 44 in which the weather stripping is hermetically sealed.

While not specifically illustrated, the side walls 18 and end walls 20 of the enclosure 16 are interconnected with fasteners that extend, for example, through an end wall and into an open end of one of the C-shaped channels 30 of a side wall. Further, the insulation strip 36 at one end of the enclosure is notched at one end 46 and includes a square hole 48 through its center for purposes to be described in more detail hereafter. The insulation strip 36 at the opposite end of the enclosure also has a notch in one end 50. Each end wall 20 has a circular passage 52 therethrough at one end thereof for a purpose that will become clear hereafter.

Supported within the enclosure 16 are a plurality of elongated reflectors 54 of parabolic transverse cross-section with six of such reflectors being shown for illustrative purposes. The collectors support a liquid heating system 56 (FIG. 1E) and optionally a solar cell system 58 so that solar energy impinging the reflectors can be concentrated on the liquid heating system and/or the solar cell system. Looking first at FIGS. 1C and 1D, the reflectors 54 can be seen to be made from identical arcuate extrusions 60 (FIG. 1C) with each arcuate extrusion defining in cross-section half of a parabola so that when the arcuate extrusions are mounted in abutting adjacent relationship (FIG. 1D) the combined cross-section is parabolic. The arcuate extrusions have longitudinally extending grooves 62 of C-shaped cross-section formed along an outer surface thereof so that identical end walls 64 of each reflector can be connected to the arcuate extrusions to secure them together with fasteners that extend through the end walls and into the open ends of a C-shaped channel. The arcuate extrusions and the end walls are preferably made of a metal material such as aluminum. A strip of semi-rigid but flexible reflective material 66 is overlaid onto the integrated arcuate extrusions with the flexible strip being frictionally and mechanically held in place by positioning side edges 68 of the reflective strip, which is rectangular in configuration, beneath overhanging lips 70 defined along the upper edges of each arcuate extrusion 60. It could be further adhesively secured in place if desired. The flexible strip is of course dimensioned so that when its edges are confined beneath the overhanging lips of the arcuate extrusions, the flexible strip will assume the configuration of the underlying integrated arcuate extrusions on which it is supported, which is parabolic. The flexible strip can be any suitable material so long as it has a highly reflective upper surface which could be coated in any known manner on the top surface of the flexible strip.

Figures 1C, 1D:
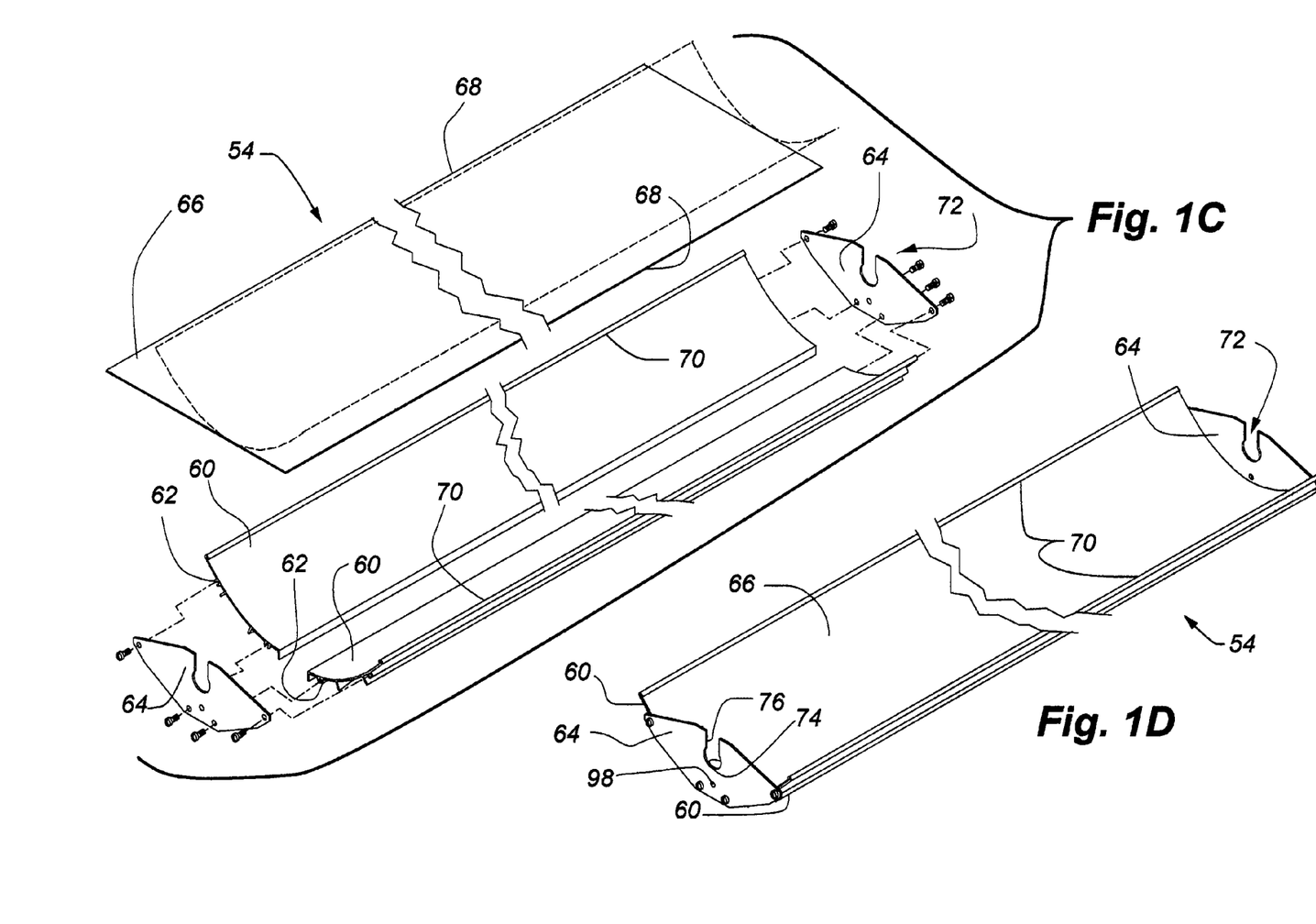
FIG. 1C is an exploded isometric looking downwardly on a parabolic reflector used in the collector of the present invention.
FIG. 1D is an isometric of the assembled reflector illustrated in FIG. 1C.

FIG. 1D shows a reflector 54 fully assembled, and it can be seen that each end wall has a key hole 72 formed therein which opens through a top edge of the end wall and has a circular lower portion 74 communicating with a vertically sided neck 76. The neck is of smaller dimension than the circular lower portion for a purpose to be described hereafter.

Figure 1E:
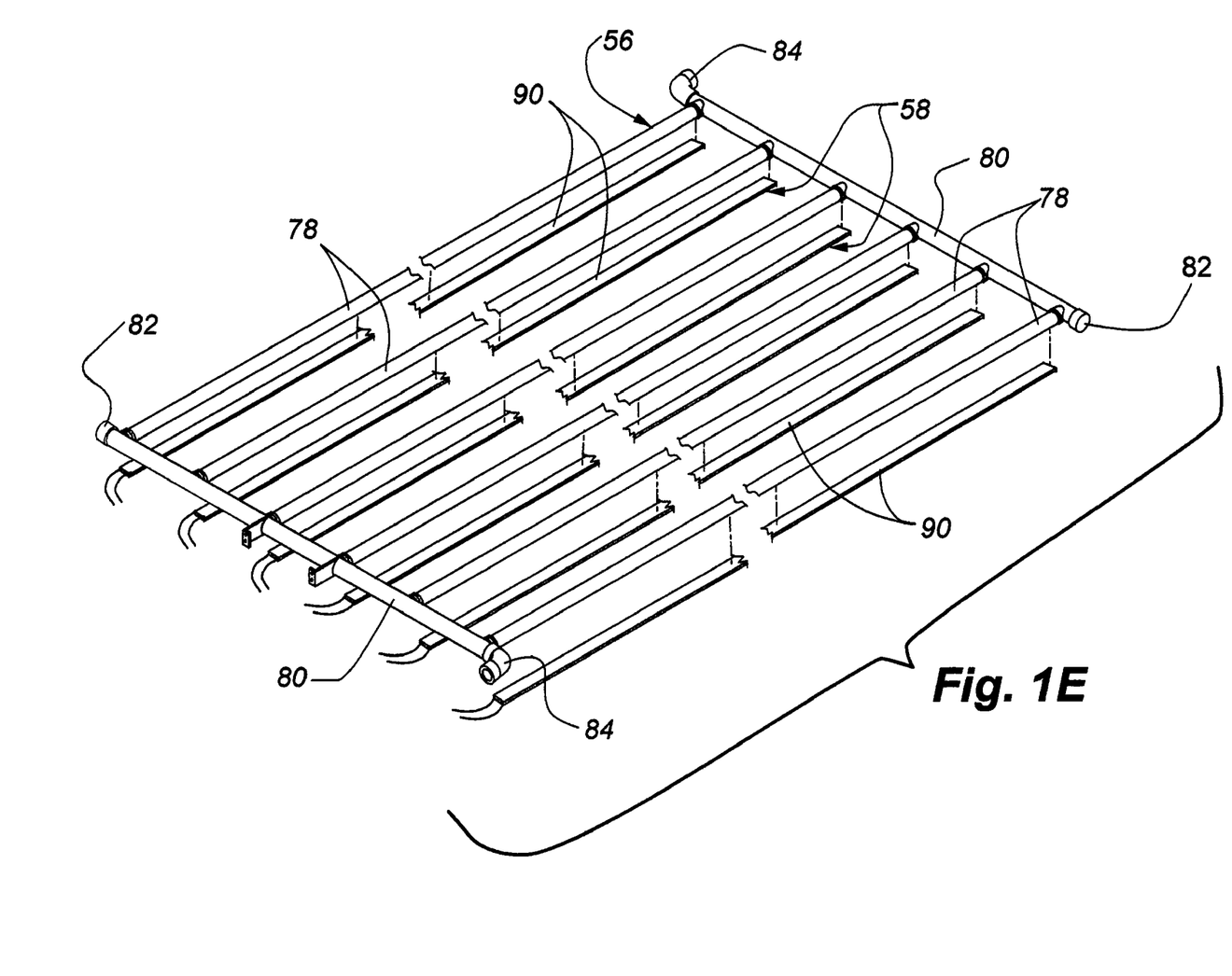
FIG. 1E is a diagrammatic isometric of a fluid and solar cell system used in the collector of FIG. 1A.
Figure 2A:
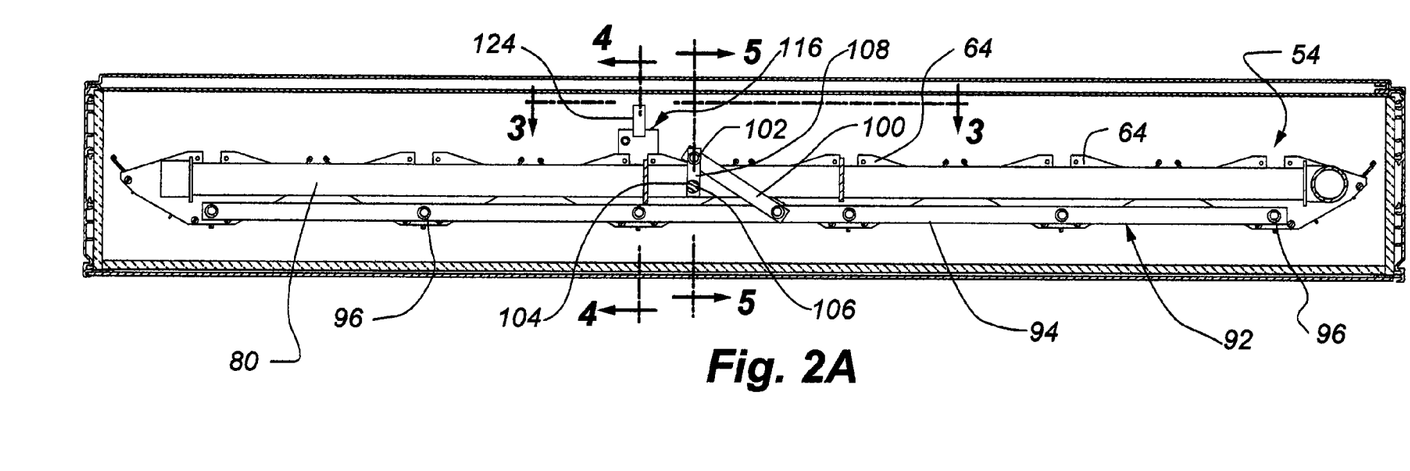
FIG. 2A is an enlarged section taken along line 2A-2A of FIG. 1A.
Figure 2B:
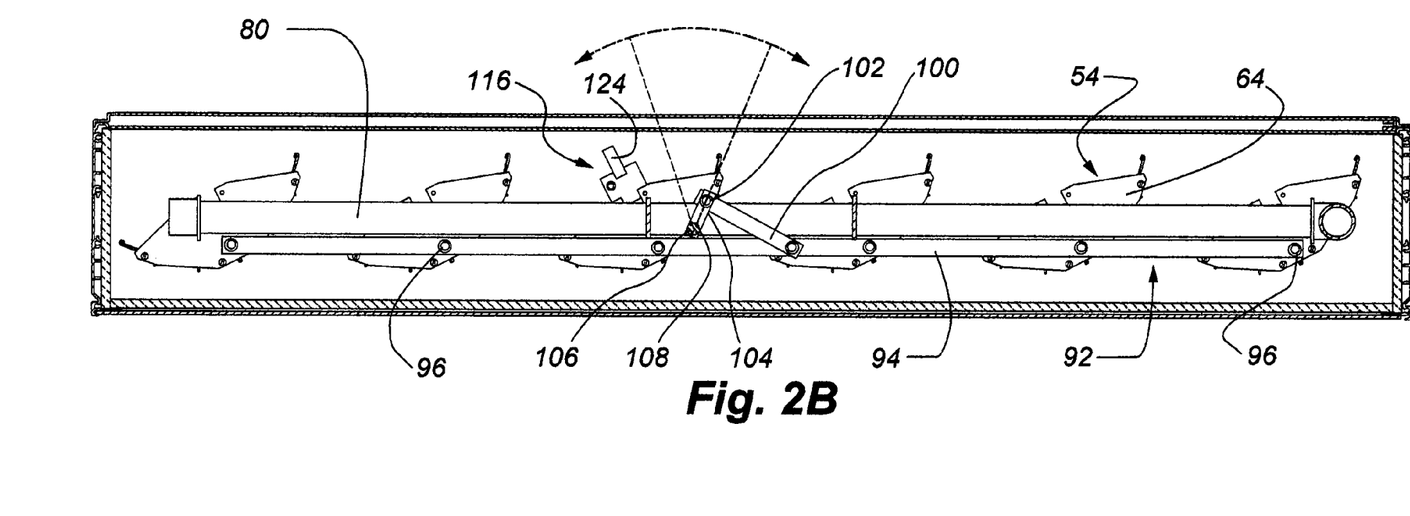
FIG. 2B is a section similar to FIG. 2A with the reflectors shown in a tilted position relative to that of FIG. 2A.

With reference to FIG. 1E, the liquid heating system 56 can be seen to include a plurality of elongated liquid transfer tubes 78, which are mounted in parallel relationship with each other and communicate at opposite ends with perpendicular manifolds 80. Each manifold is closed at one end 82 and has an L-shaped connector 84 at the opposite end so liquid can be fed into one manifold through a connector 84 and passed along the length of each parallel tube for collection in the manifold at the opposite end of the tubes and removed from that manifold through its L-shaped connector 84. The liquid passed from one manifold to the other manifold can then be circulated through a heat-transfer system (not shown) which can be used, for example, to heat air or water at a remote location. The liquid could be any suitable liquid, but if the collector is going to be used in a cold environment, the liquid is preferably one with a low freezing temperature, such as a water/glycol mix. An inlet tube 86 and outlet tube 88 seen in FIG. 1 are connected to the L-shaped connectors for circulating heated liquid through the heat transfer system. Also, the L-shaped connectors extend through the notch in the ends 46 and 50 (FIG. 1B) of the insulation strip at the associated end of the enclosure. It will be appreciated the L-shaped connectors would not necessarily be needed as the manifolds could extend straight and through a side of the enclosure rather than through an end. In this manner, a plurality of heating systems could be joined side-by-side by aligning and interconnecting manifolds of the systems.

In the embodiment shown in FIG. 1E, strips of solar cell material are secured to the underside of each of the parallel tubes and have electrical wires emanating from one end so that electrical energy generated by the solar cells can be transferred to a solar battery or the like where it can be used at a remote location for domestic or commercial uses.

The liquid heating system 56 is positioned so that each parallel tube 78 (FIGS. 1C and 1D) extends through the circular lower portion 74 of the keyhole 72 in opposite ends of a reflector 54 and held therein by the necks 76 so the reflectors are in fact pivotally suspended from an associated parallel tube and can be pivoted about the longitudinal axis of the associated parallel tube. Accordingly, and as will become more clear hereafter, as the reflectors are pivoted to follow the sun in a manner described hereafter, the parallel liquid-conducting tubes (FIG. 1E) and strips 90 of solar cell material in the solar cell system 58 remain stationary relative to the enclosure 16 in which the reflectors and liquid-carrying system are mounted.

With reference to FIGS. 1E, 2A, 2B, and 3-5, a linkage system 92 for pivoting the reflectors about their associated parallel tubes 78 is illustrated. The linkage can be seen to include an elongated transverse bar or link 94 at one end of the enclosure 16 that runs beneath the manifold 80 at the same end of the enclosure and is mounted for swinging arcuate movement while remaining in a parallel relationship with the enclosure. The transverse bar is connected with threaded fasteners 96 or the like at spaced locations along its length to the end wall 64 of each of the parabolic reflectors 54 through an opening 98 (FIG. 1D) provided in the end wall of each reflector. It will therefore be appreciated that as the elongated bar is swung through an arc while remaining parallel to the enclosure, the reflectors will pivot about the associated parallel tubes between various angular positions.

Figure 3:
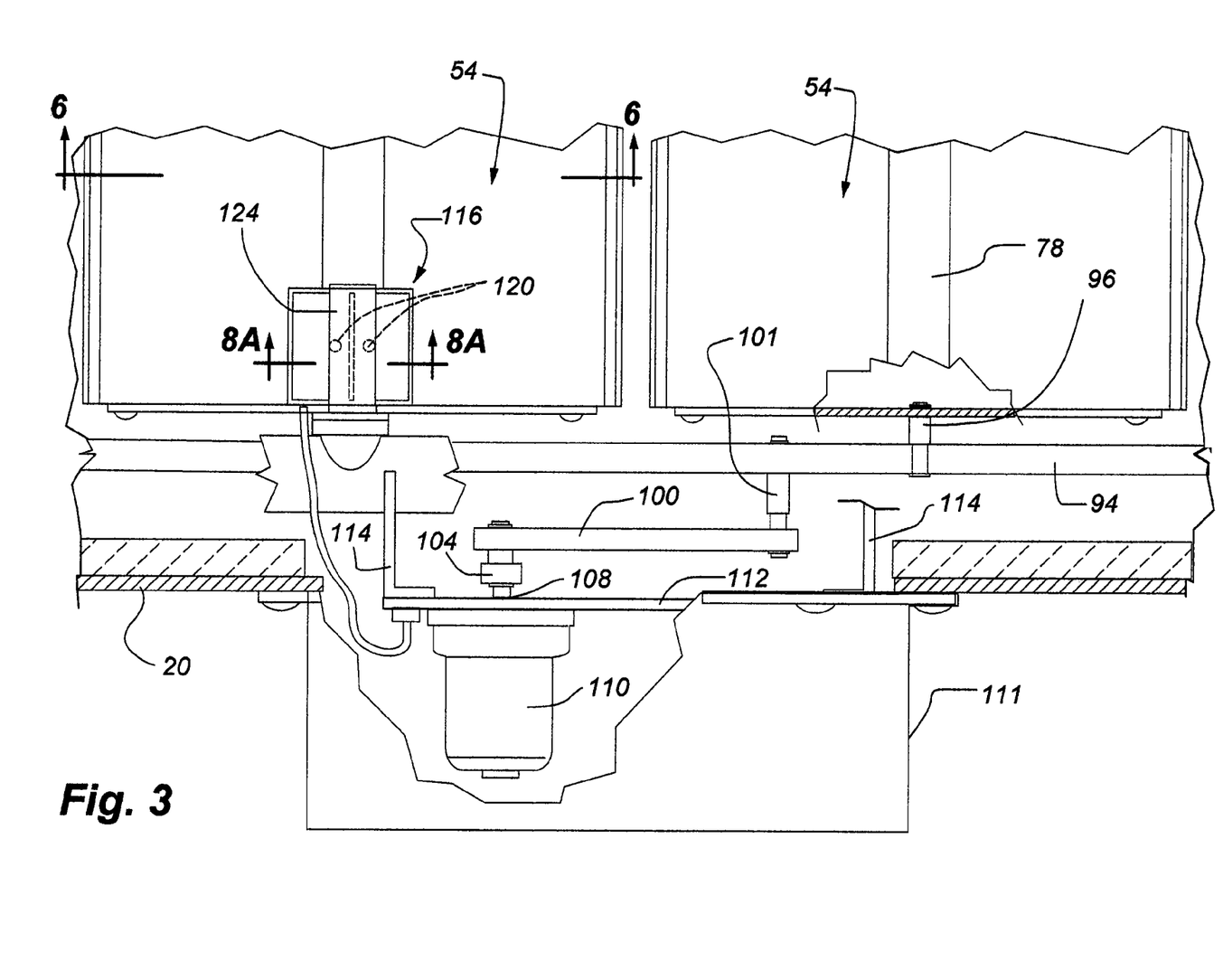
FIG. 3 is an enlarged section taken along line 3-3 of FIG. 2A.

The elongated transverse bar 94 is swung in the aforenoted manner through a connecting link 100 that is secured to the transverse elongated bar at a slightly off center location on the bar with a threaded fastener 101 or the like and with the opposite end of the connecting link being secured to the free end 102 of a drive link 104 whose opposite end 106 is keyed or pinned to the output shaft 108 of a motor 110. The motor could be a DC, AC or stepper motor. With reference to FIG. 3, the motor can be seen to be mounted within a closure box 111 on a base plate 112 that is in turn secured to a pair of brackets 114 welded or otherwise secured to the manifold 80 adjacent thereto so the drive shaft of the motor is horizontally disposed. The brackets extend through the square hole 48 in the insulation strip at the associated end of the enclosure. For a purpose to be described hereafter, the motor is a reversible motor and can be driven in either direction. For example, in FIG. 2A, the drive link 104 of the linkage system is vertically oriented and the elongated transverse link 94 is spaced a predetermined distance from the overlying manifold 80. As the drive link is pivoted clockwise to the position of FIG. 2B, the connecting link 100 causes the transverse bar to shift closer to the manifold and moving between these position the reflectors 54 connected to the transverse link are pivoted about their associated parallel tubes 78.

A solar switch 116 is anchored to one of the centermost reflectors 54 along a top edge of the end wall adjacent to the motor 110 with the solar switch being oriented to be above, and along a hypothetic plane 117 (FIGS. 8A and 8B) perpendicular to the reflector including, the parallel liquid tube 78 on which the reflector is mounted. The tube, as mentioned previously, extends along the axis of generation of the parabolic reflector. The hypothetic plane divides the parabolic reflector into two equal confronting halves. In other words, the switch is mounted perpendicular to the opening direction of the parabolic reflector and above the parallel tube extending through the reflector.

Figure 8A:
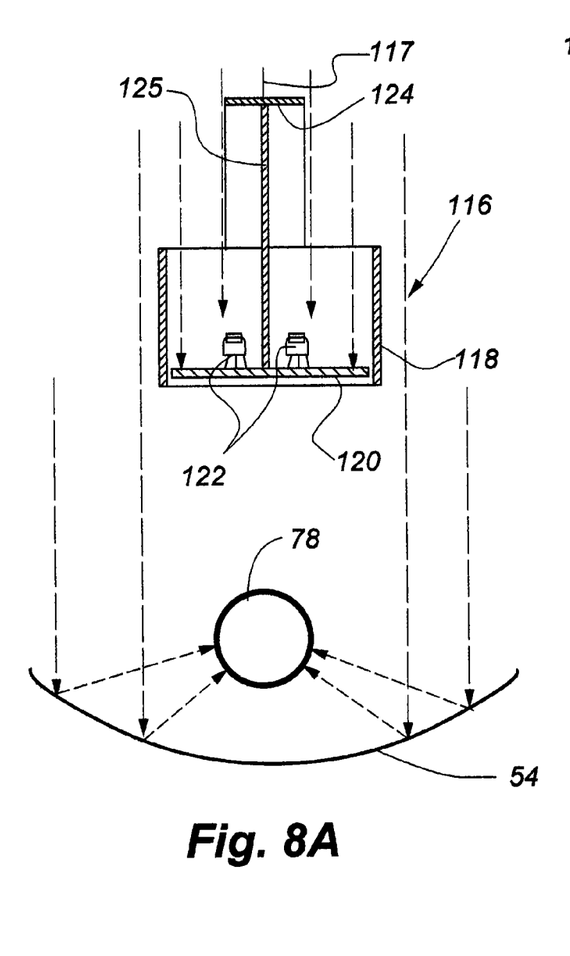
FIG. 8A is an enlarged section taken along line 8A-8A of FIG. 3.

The solar switch 116 itself is best seen in FIGS. 8A, 8B, 9 and 10 to include a box-like enclosure 118 having an open top and a closed bottom wall 120 upon which a pair of laterally spaced solar cells 122 are mounted. The solar cells are mounted on either side of a vertical divider wall 125 extending radially from and above the parallel tube 78 of the reflector 54 on which the solar switch is mounted so the divider wall remains perpendicular to the opening direction of the parabolic reflective surface of the reflector. An arcuate blocking bar 124 is anchored to opposite sides of the box and supported by the divider wall above the solar cells. The divider wall components extend along a center line of the blocker bar. The blocking bar has a width at least as wide as the spacing between the outer edges of the solar cells so as to cast a shadow on both solar cells when solar radiation from the sun is perpendicular to the blocking bar. The shadow cast by the blocking bar prevents the sun's rays from impinging either of the solar cells in such alignment of the switch with the sun but when the sun shifts through the day without movement of the solar switch, as shown for example in FIG. 8B, the solar radiation will communicate with one of the solar cells generating electricity, which is transferred to the motor to drive the motor in a clockwise direction, as viewed in FIGS. 8A and 8B, until the shadow cast by the blocking bar again prevents the radiation from impinging a solar cell, as shown in FIG. 8A. When this alignment is re-established, electricity to the motor is stopped and the motor is de-energized to retain this aligned position until the sun has again traversed a predetermined portion of the sky so its rays impinge one or the other of the solar cells whereupon the motor is again energized.

In this manner, the motor 110 is incrementally energized throughout the day to incrementally pivot the reflectors 54 through the linkage that interconnects the motor with the reflectors so the opening direction of the reflectors remains substantially perpendicular to the sun throughout the day. Incrementally maintaining this alignment causes the sun's rays being reflected off the reflective surfaces of the parabolic reflectors to be concentrated along the axis of generation of the parabolas where the parallel tubes 78 are positioned. Accordingly, the solar radiation is concentrated on the parallel tubes, which are preferably painted or anodized in black to optimally absorb the radiation. It has been found that by concentrating the radiation off a parabolic reflector, the energy captured is multiples of that of direct solar radiation.

Figure 6:
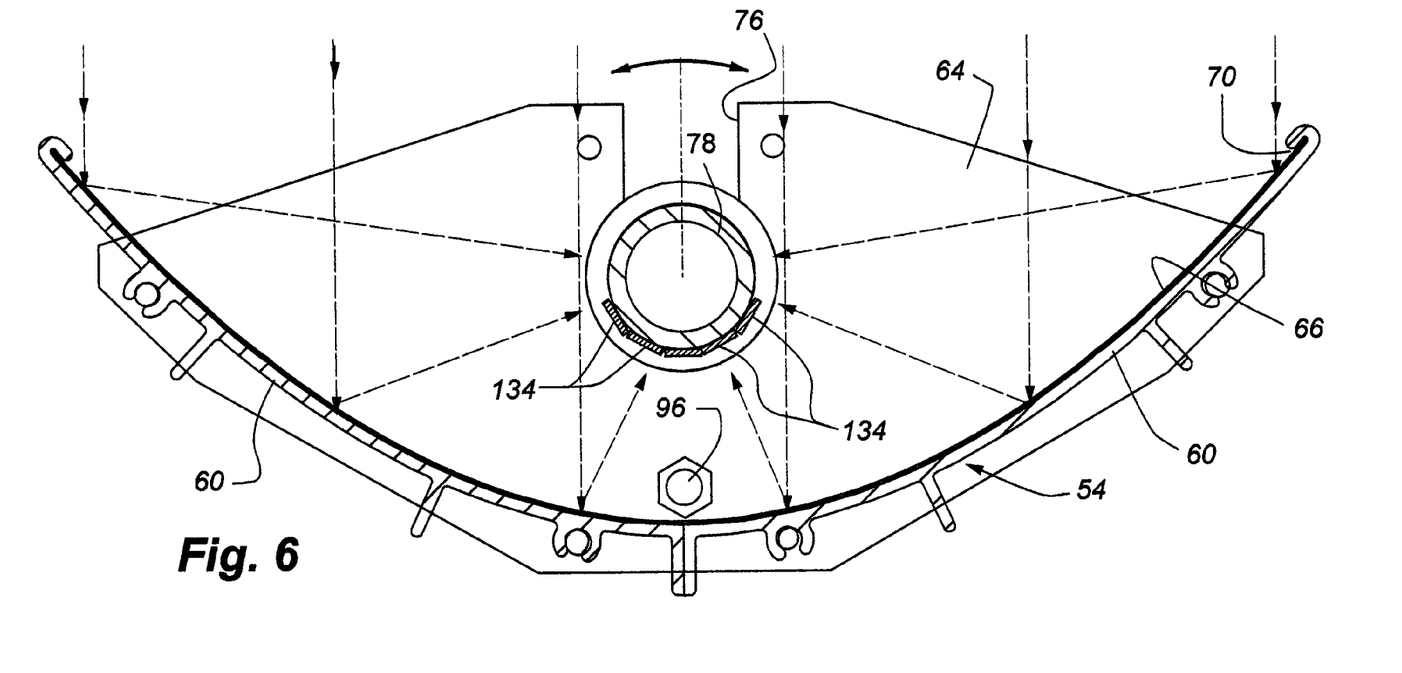
FIG. 6 is an enlarged section taken along line 6-6 of FIG. 3.
Figure 7A:
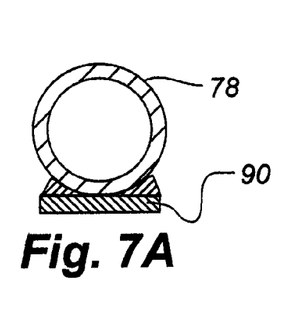
FIG. 7A is a transverse section taken through a liquid-conducting tube with a solar cell strip mounted thereon in one variation of the present invention.
Figure 7B:
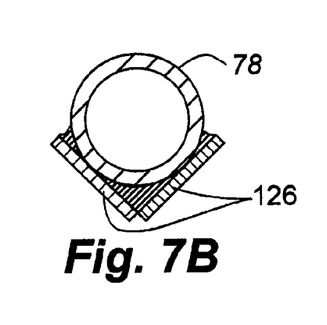
FIG. 7B is a section similar to FIG. 7A showing a different variation.
Figure 7C:
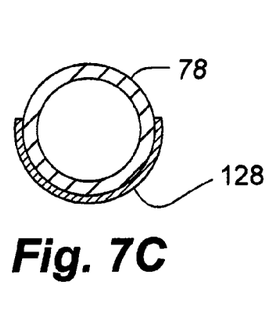
FIG. 7C is a section similar to FIG. 7A with still another variation.
Figure 7D:
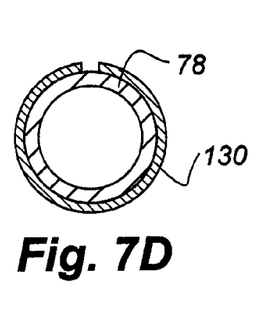
FIG. 7D is a section similar to FIG. 7A with still a further variation.
Figure 7E:
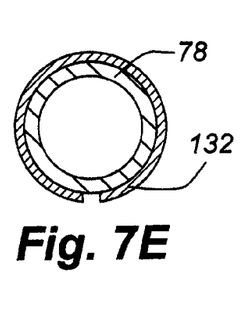
FIG. 7E is a section similar to FIG. 7A with still a further variation.
Figures 8B, 9, 10:
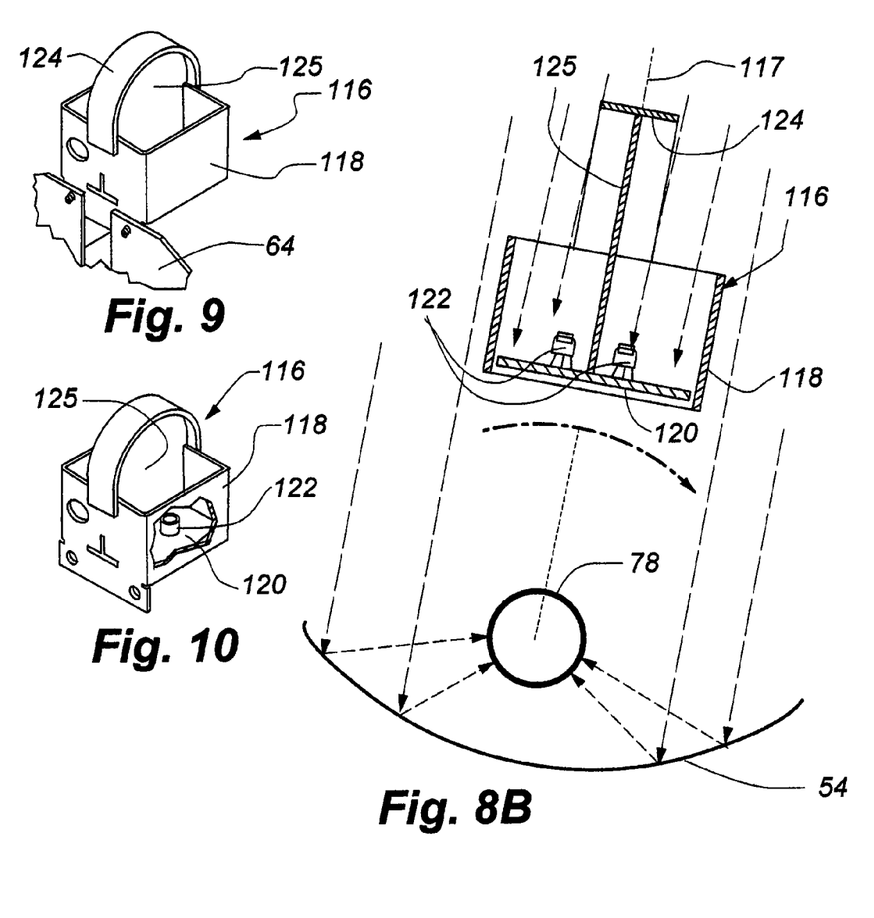
FIG. 8B is a section similar to FIG. 8A with the reflector and solar switch having been inclined relative to the angle of the rays of the sun.
FIG. 9 is an isometric of the solar switch connected to one of the reflectors.
FIG. 10 is an isometric similar to FIG. 9 with portions removed for clarity.

While the parabolic reflectors 54 can have simply a liquid transfer tube 78 along its axis of generation, as shown in FIGS. 8A and 8B, a solar cell strip 90, such as previously mentioned with regard to FIG. 1E, could be attached in any suitable manner along the bottom edge of a rigid support such as a parallel tube 78 with such an arrangement illustrated in FIG. 7A. The solar cell strip thereby also receives concentrated solar radiation for optimally generating electricity for remote use. Other systems for mounting a strip or strips of solar cell material to a parallel tube are illustrated in FIGS. 6 and 7B-7E with 7B illustrating two perpendicular such strips 126 secured along the undersurface of a parallel tube 78. FIG. 7C shows a solar cell strip 128 arcuately covering the bottom half of a parallel tube while FIG. 7D shows a strip 130 substantially encompassing the entire circumference of a parallel tube 78 with only a small gap at the top. A solar cell strip 132 in FIG. 7E is reverse that of FIG. 7D. Still another arrangement is shown in FIG. 6 where a plurality of flat solar cell strips 134 are secured along an undersurface of a parallel tube 78, and it will be appreciated from the above that many variations of solar cell strips in combination with a liquid transfer tube are possible and not all of such arrangements have been illustrated. In addition, the solar cell strip 90 could be mounted on a rigid support (not shown) other than a liquid carrying tube so that only electricity would be generated by the collector.

It will be appreciated from the above that an enclosed solar collector utilizing a plurality of elongated parabolic reflectors has been illustrated with the reflectors being mounted so as to individually pivot together while following the course of the sun in its movement across the sky and so that each reflector remains substantially perpendicular to the solar radiation emanating from the sun. The pivotal movement is established by a unique solar switch that energizes and de-energizes a motor for pivoting the reflectors in unison and incrementally throughout the day so that each reflector remains substantially perpendicular to the sun. At the end of the day and after the sun has set in the west, a timer in a micro-computer circuit or the like, which is not illustrated, energizes the motor in a reverse direction so the reflectors are preset and inclined to the east in a direction to receive solar radiation the next morning when the sun rises with the reflectors substantially perpendicular to the rising sun. A computer system for operating the solar collector of the present invention is deemed to be within the skill of those in the art and, accordingly, a description thereof is not felt necessary.

Although the present invention has been described with a certain degree of particularity, it is understood the disclosure has been made by way of example, and changes in detail or structure may be made without departing from the spirit of the invention as defined in the appended claims.

The invention claimed is:

1. A solar collector comprising in combination:
a plurality of elongated reflectors of substantially parabolic transverse cross-section defining an axis of generation, a fluid-conducting tube supporting each of said reflectors along said axis of generation for pivotal movement about a longitudinal axis;
a mounting system supporting said tubes, said mounting system including an enclosed box having a top glass plate overlying said reflectors;
a motor drive and linkage interconnecting said motor drive to said reflectors to incrementally pivot said reflectors, the linkage comprising;
a transverse link pivotally mounted directly to each of said reflectors at one end of said reflectors;
a connecting link pivotally connected at a first end directly to the transverse link at an off-center point of the transverse link;
a drive link pivotally connected to a second end of the connecting link and to a drive shaft of said motor drive;
wherein said motor drive and linkage causes the transverse link to swing in an arcuate manner in a forward and reversible movement, thereby pivoting the plurality of elongated reflectors about said longitudinal axis; and
a solar switch for selectively energizing and de-energizing said motor drive, the solar switch comprising:
a base having a longitudinal reference line;
a pair of laterally spaced solar cells being on opposite sides of said longitudinal reference line; wherein said base further comprises a wall between said solar cells coincident with said reference line; and
an arcuate solar radiation blocking bar mounted on said base and extending along said reference line, said blocking bar to cast a shadow on both of said solar cells when the solar radiation is coming from directly above said switch.

2. The collector of claim 1 wherein said axis of generation and longitudinal axis are co-axial.

3. The collector of claim 1 wherein said reflectors pivot about said fluid-conducting tubes.

4. The collector of claim 1 further including manifolds interconnecting said fluid-conducting tubes at opposite ends of said tubes, said manifolds being in fluid communication with a supply of heat-transfer fluid such that said fluid can be circulated through said fluid-conducting tubes.

5. The collector of claim 1 wherein said solar switch is operatively connected to a reflector for pivotal movement with said reflectors.

6. A solar collector comprising in combination:
a plurality of elongated reflectors of substantially parabolic transverse cross-section defining an axis of generation, a rigid support extending along each of said axes of generation, and having solar cell material mounted thereon, said rigid supports supporting said reflectors for pivotal movement about a longitudinal axis of the reflector;
a mounting system supporting said rigid supports, said mounting system including an enclosed box having a top glass plate overlying said reflectors;
a motor drive and linkage interconnecting said motor drive to said reflectors to incrementally pivot said reflectors, the linkage comprising;
a transverse link pivotally mounted directly to each of said reflectors at one end of said reflectors;
a connecting link pivotally connected at a first end directly to the transverse link at an off-center point of the transverse link;
a drive link pivotally connected to a second end of the connecting link and to a drive shaft of said motor drive;
wherein said motor drive and linkage causes the transverse link to swing in an arcuate manner in a forward and reversible movement, thereby pivoting the plurality of elongated reflectors about said longitudinal axis; and
a solar switch for selectively energizing and de-energizing said motor drive, the solar switch comprising:
a base having a longitudinal reference line;
a pair of laterally spaced solar cells being on opposite sides of said longitudinal reference line; wherein said base further comprises a wall between said solar cells coincident with said reference line; and
an arcuate solar radiation blocking bar mounted on said base and extending along said reference line, said blocking bar to cast a shadow on both of said solar cells when the solar radiation is coming from directly above said switch.

7. The collector of claim 6 wherein said axis of generation and longitudinal axis are co-axial.

8. The collector of claim 6 wherein said reflectors pivot about said rigid supports.

9. The collector of claim 6 wherein said solar switch is operatively connected to a reflector for pivotal movement with the reflectors.

10. The collector of claim 6 wherein said rigid support is a liquid-conducting tube.

* * * * *